(12) United States Patent
You et al.

(10) Patent No.: US 12,348,167 B2
(45) Date of Patent: *Jul. 1, 2025

(54) POWER MODULE AND MOTOR DRIVE SYSTEM USING THE SAME

(71) Applicants: Hyundai Motor Company, Seoul (KR); Kia Corporation, Seoul (KR)

(72) Inventors: Myung Ill You, Gwangju (KR); Hyun Koo Lee, Seoul (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/733,631

(22) Filed: Jun. 4, 2024

(65) Prior Publication Data

US 2024/0322731 A1    Sep. 26, 2024

Related U.S. Application Data

(63) Continuation of application No. 17/985,562, filed on Nov. 11, 2022, now Pat. No. 12,028,006.

(30) Foreign Application Priority Data

Jun. 15, 2022  (KR) .................. 10-2022-0073098

(51) Int. Cl.
  *H02M 1/088*  (2006.01)
  *H02M 7/48*  (2007.01)
  *H02P 27/06*  (2006.01)

(52) U.S. Cl.
  CPC .............. *H02P 27/06* (2013.01); *H02M 7/48* (2013.01)

(58) Field of Classification Search
  CPC ...... H02P 27/06; H02P 25/18; H02P 2207/07; H02M 7/48; H02M 7/003; H02M 7/5387; H02M 1/10
  See application file for complete search history.

(56) References Cited

U.S. PATENT DOCUMENTS 9,922,911 B1  3/2018  Park et al.
10,211,133 B2  2/2019  Grassmann et al.
(Continued)

FOREIGN PATENT DOCUMENTS

DE  212020000704 U1  3/2022
JP  3826667 B2  9/2006
(Continued)

OTHER PUBLICATIONS

Deshpande et al., "High Power Density 1700-V/ 300-A Si-IGBT and SiC-MOSFET Hybrid Switch-based Half-bridge Power Module," 2020 IEEE Energy Conversion Congress and Exposition (ECCE), Oct. 11-15, 2020, Detroit, MI, pp. 3979-3986, doi: 10.1109/ECCE44975.2020.9236124.
(Continued)

*Primary Examiner* — Muhammad S Islam
(74) *Attorney, Agent, or Firm* — Slater Matsil, LLP

(57) ABSTRACT

An embodiment provides a power module that includes a first substrate comprising first material, a plurality of first switching elements on the first substrate, a second substrate comprising second material having a lower thermal conductivity than the first material, a plurality of second switching elements and a third switching element on the second substrate, and a connection spacer configured to electrically connect the first substrate and the second substrate.

20 Claims, 5 Drawing Sheets

(56) References Cited

U.S. PATENT DOCUMENTS

| | | | |
|---|---|---|---|
| 11,075,137 B2 | 7/2021 | Lin et al. | |
| 2011/0320171 A1 | 12/2011 | Okayama et al. | |
| 2012/0256194 A1 | 10/2012 | Yoshihara et al. | |
| 2015/0223339 A1 | 8/2015 | Nakamura et al. | |
| 2018/0206359 A1 | 7/2018 | McPherson et al. | |
| 2021/0036699 A1* | 2/2021 | Lee | H03K 17/0812 |
| 2021/0057372 A1 | 2/2021 | Oh et al. | |
| 2021/0183795 A1* | 6/2021 | Lee | H01L 23/49562 |
| 2022/0320049 A1 | 10/2022 | Onodera et al. | |
| 2023/0246095 A1* | 8/2023 | Joo | H01L 29/7802 |
| | | | 257/335 |

FOREIGN PATENT DOCUMENTS

| | | | |
|---|---|---|---|
| JP | 5267412 B2 | 8/2013 | |
| KR | 20180052143 A | 5/2018 | |
| KR | 102048478 B1 | 11/2019 | |
| KR | 102100859 B1 | 4/2020 | |

OTHER PUBLICATIONS

Ning et al., "The Engineering Design of SiC Hybrid Switch Series," 2019 IEEE 3rd International Electrical and Energy Conference (CIEEC), Sep. 2019, Beijing, China, pp. 1337-1342, doi: 10.1109/CIEEC47146.2019. CIEEC-2019486.

* cited by examiner

POWER MODULE AND MOTOR DRIVE SYSTEM USING THE SAME

CROSS-REFERENCE TO RELATED APPLICATIONS

The present application is a continuation of U.S. application Ser. No. 17/985,562 filed on Nov. 11, 2022, which claims priority of Korean Patent Application No. 10-2022-0073098 filed on Jun. 15, 2022, which application is hereby incorporated by reference.

TECHNICAL FIELD

The present disclosure relates to a power module and a motor drive system using the same.

BACKGROUND

A power conversion device (e.g., inverter), which is one of the core parts of hybrid electric vehicles and electric vehicles, is a major part of eco-friendly vehicles, and many technologies are being developed, and the development of a power module, which is a core part of the power conversion device and accounts for the most cost, is a core technology in the field of eco-friendly vehicles.

A double-sided cooling power module requires the electrical connection between upper and lower substrates for circuit configuration. At this time, a via spacer is used to serve to electrically connect the upper and lower substrates.

Meanwhile, the power module requires cost reduction because of a high manufacturing cost, and there is a problem in that when the size is increased by integrating a system for high specifications and cost reduction, the power module is adversely affected because the upper and lower substrates are bent.

In other words, in the high-performance power module, the number of chips is increased or the sizes of chips are increased to cover the amount of power, and when the number and size of chips are increased, the size of each substrate configuring the power module should also be increased. However, as the size of the insulating substrate increases, it becomes vulnerable to bending due to high temperature generated when the chip is operated, resulting in a durability problem.

As described above, as the insulating substrate of the power module is formed of one large-sized substrate, bending largely occurs at a high temperature by the operation of the chip, so that there is a need for a method of securing high performance and securing durability.

The matters explained as the background art are for the purpose of enhancing the understanding of the background of the present disclosure and should not be taken as acknowledging that they correspond to the related art already known to those skilled in the art.

SUMMARY

The present disclosure relates to a power module, which secures durability at a high temperature and improves reliability by separately configuring an insulating substrate when a plurality of inverters is configured, and reduces an internal parasitic inductance by optimizing the arrangement of a bus bar, and a motor drive system using the same.

An object of the present disclosure is to provide a power module, which secures durability at a high temperature and improves reliability by separately configuring an insulating substrate when a plurality of inverters is configured, and reduces an internal parasitic inductance by optimizing the arrangement of a bus bar, and a motor drive system using the same.

In order to achieve the object, a power module according to the present disclosure may include: a first substrate on which a plurality of first switching elements formed of a first type semiconductor are mounted; a second substrate on which a plurality of second switching elements formed of a second type semiconductor and one third switching element formed of the first type semiconductor or the second type semiconductor are mounted; and a connection spacer configured to electrically connect the first substrate and the second substrate.

Each of the first switching element, the second switching element and the third switching element may include at least one chip Each of the first switching elements may include two chips, each of the second switching elements includes two chips, and the third switching element includes one chip.

The first type semiconductor may be made of SiC, and the second type semiconductor may be made of Si.

The third switching element may be formed of the first type semiconductor.

The first substrate may be configured to have a relatively high thermal conductivity characteristic compared to the second substrate.

The first substrate may be composed of a first upper substrate and a first lower substrate, and the first switching element may be disposed between a lower surface of the first upper substrate and an upper surface of the first lower substrate, and the second substrate may be composed of a second upper substrate and a second lower substrate, and the second switching element may be disposed between a lower surface of the second upper substrate and an upper surface of the second lower substrate.

Each of the first upper substrate, the first lower substrate, the second upper substrate, and the second lower substrate may be formed of an upper metal layer, a lower metal layer, and an insulator interposed between the upper metal layer and the lower metal layer.

The first switching element may be composed of a first chip and a second chip and disposed to be spaced apart from the first substrate, and the second switching element may be composed of a third chip and a fourth chip and disposed to be spaced apart from the second substrate.

The connection spacer may be electrically connected to the first chip on the first substrate and the third chip on the second substrate.

The third switching element may be disposed to be spaced apart between the third chip and the fourth chip on the second substrate.

The first substrate and the second substrate may have a plurality of bus bars disposed at one sides side by side, and a plurality of control pins disposed at the other sides side by side.

A P-type bus bar, an N-type bus bar, and a first output bus bar are configured on the first substrate, and the P-type or N-type bus bar, a second output bus bar, and a switching bus bar may be configured on the second substrate.

A P-type bus bar, a first N-type bus bar, and a first output bus bar may be configured on the first substrate, a second N-type bus bar, a second output bus bar, and a switching bus bar may be configured on the second substrate, and the first N-type bus bar, the P-type bus bar, the second N-type bus bar, the switching bus bar, and the second output bus bar may be arranged at one sides of the first substrate and the second substrate side by side.

The first output bus bar and the second output bus bar may be disposed to be diagonally spaced farthest away from the other side of the first substrate and one side of the second substrate.

A first control pin configured to provide a control signal to the first chip and a second control pin configured to provide the control signal to the second chip may be configured on the first substrate, a third control pin configured to provide a control signal to the third chip and a fourth control pin configured to provide the control signal to the fourth chip may be configured on the second substrate, and the first control pin and the second control pin of the first substrate, and the third control pin and the fourth control pin of the second substrate may be arranged to be spaced apart from each other at the other sides of the first and second substrates.

The first substrate, the second substrate, and the connection spacer may be integrally molded.

Meanwhile, in the motor drive system using the power module, a first inverter, a second inverter, and a switching inverter are implemented using three power modules, a first power module among the three power modules may include a first leg of the first inverter, a first leg of the second inverter, and a first switch of a switching switch part, a second power module among the three power modules may include a first leg of the second inverter, a second leg of the second inverter, and a second switch of the switching switch part, and a third power module among the three power modules may include a first leg of a third inverter, a first leg of the third inverter, and a third switch of the switching switch part.

The power module composed of the above-described structure can secure high-temperature durability of the insulating substrate and improve reliability by separately configuring the insulating substrate when the plurality of inverters is configured.

In addition, as the plurality of inverters are electrically connected by the connection spacer and some of the bus bars of each inverter are shared, the number of bus bars are reduced, and the internal parasite inductance is reduced by the arrangement structure of the bus bar.

BRIEF DESCRIPTION OF THE DRAWINGS

The above and other objects, features and other advantages of the present disclosure will be clearly understood from the following detailed description when taken in conjunction with the accompanying drawings, in which.

DETAILED DESCRIPTION OF ILLUSTRATIVE EMBODIMENTS

Figure 1:
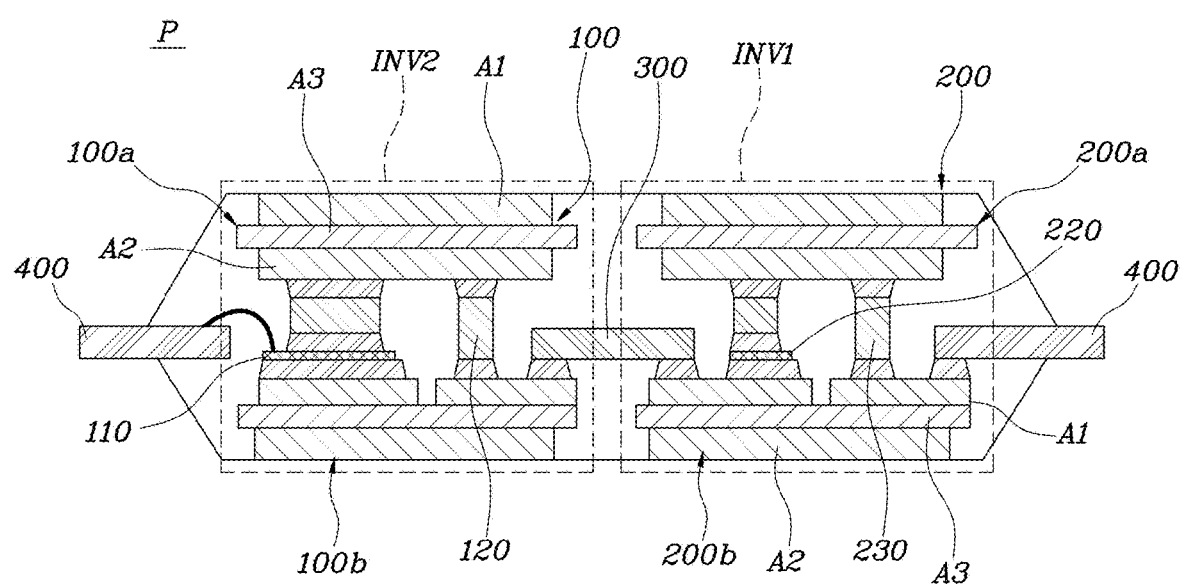
FIG. 1 is a view showing a power module according to the present disclosure.

Hereinafter, a power module according to preferred embodiments of the present disclosure will be described with reference to the accompanying drawings.

Specific structural or functional descriptions for exemplary embodiments of the present disclosure disclosed in the present specification or application are only exemplified for the purpose of describing the exemplary embodiments according to the present disclosure, and the exemplary embodiments according to the present disclosure may be carried out in various forms and should not be interpreted as being limited to the exemplary embodiments described in the present specification or application.

Since the exemplary embodiment according to the present disclosure may have various changes and have various forms, specific exemplary embodiments will be shown in the drawings and described in detail in the present specification or application. However, this is not intended to limit the exemplary embodiments according to the concept of the present disclosure to a specific disclosed form, and should be understood to include all changes, equivalents, or substitutes included in the spirit and technical scope of the present disclosure.

Unless defined otherwise, all terms used herein, including technical or scientific terms, have the same meaning as commonly understood by those skilled in the art to which the present disclosure pertains. Terms such as those defined in commonly used dictionaries should be interpreted as having meanings consistent with the meanings in the context of the related art, and are not interpreted as an ideal or excessively formal meaning unless explicitly defined in the present specification.

Hereinafter, the present disclosure will be described in detail by describing preferred embodiments of the present disclosure with reference to the accompanying drawings. The same reference numerals in each drawing indicate the same members.

Figure 2:
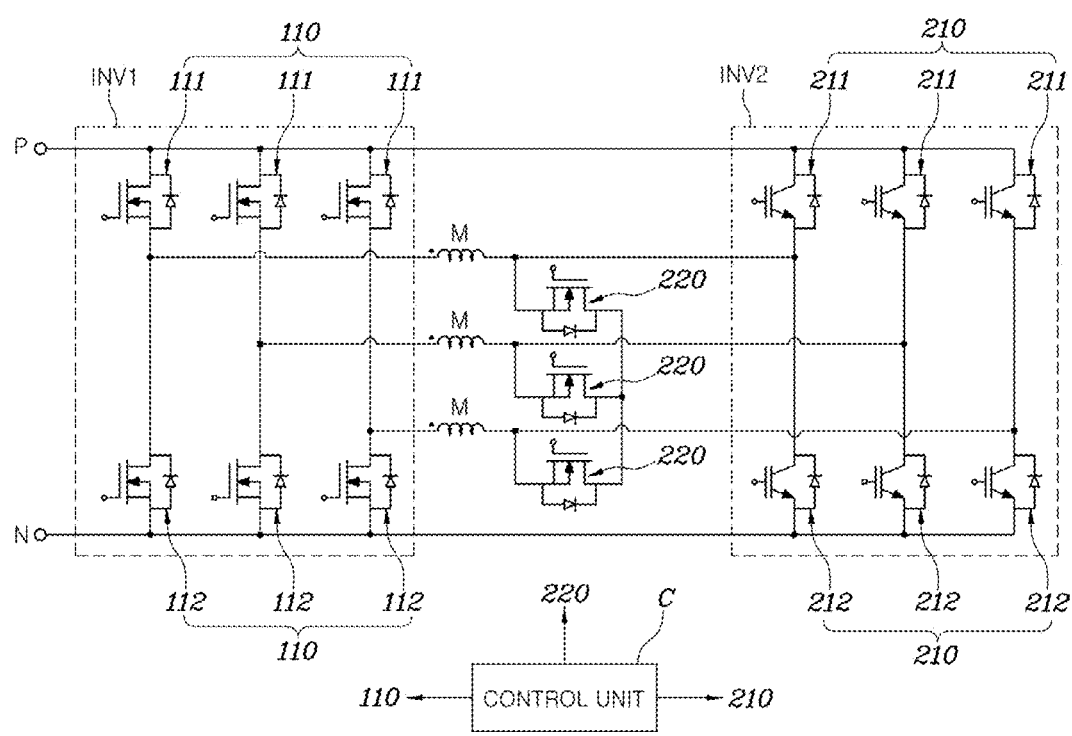
FIG. 2 is a circuit diagram for describing the power module shown in FIG. 1.
Figure 3:
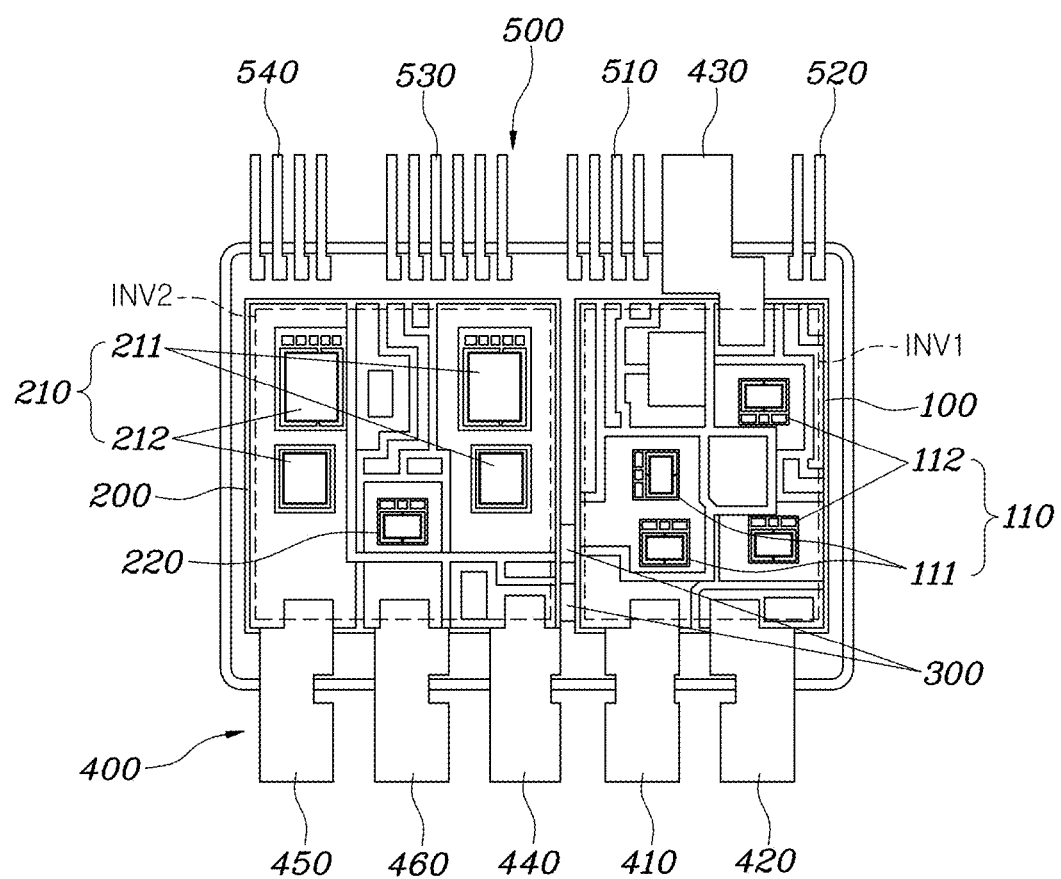
FIG. 3 is a view showing a first substrate and a second substrate of the power module shown in FIG. 1.
Figure 4:
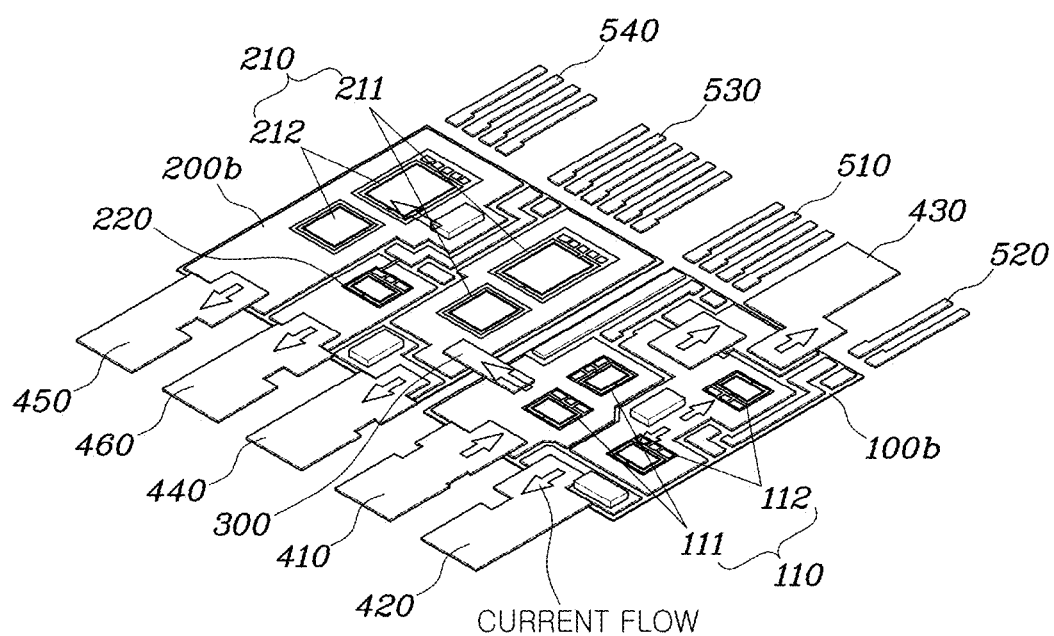
FIG. 4 is a view showing a current flow on lower portions of the first substrate and the second substrate of the power module shown in FIG. 1.
Figure 5:
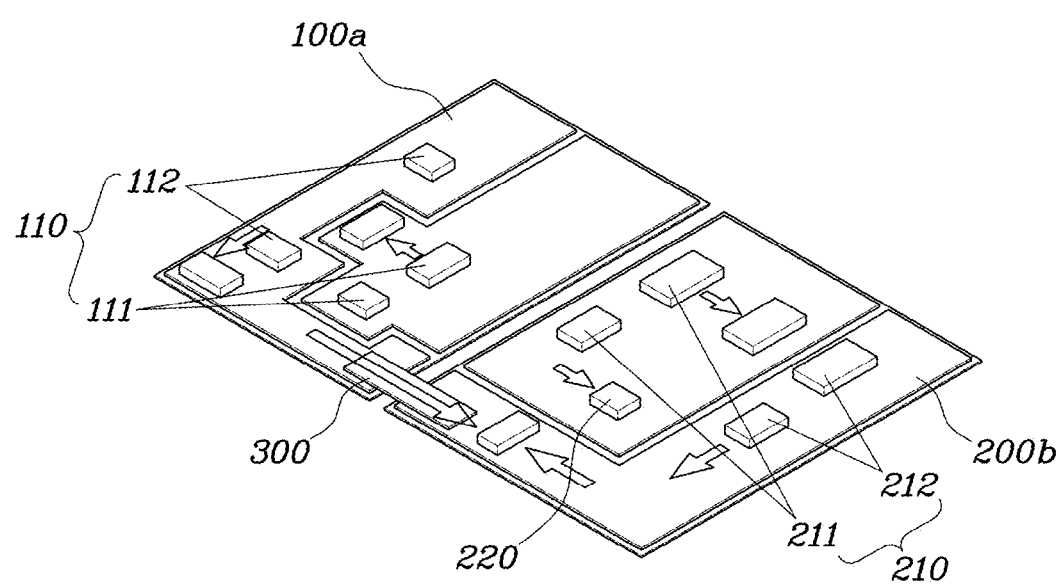
FIG. 5 is a view showing a current flow on upper portions of the first substrate and the second substrate of the power module shown in FIG. 1.

FIG. 1 is a view showing a power module according to the present disclosure, FIG. 2 is a circuit diagram for describing the power module shown in FIG. 1, FIG. 3 is a view showing a first substrate and a second substrate of the power module shown in FIG. 1, FIG. 4 is a view showing a current flow on lower portions of the first substrate and the second substrate of the power module shown in FIG. 1, and FIG. 5 is a view showing a current flow on upper portions of the first substrate and the second substrate of the power module shown in FIG. 1.

As shown in FIG. 1, a power module according to the present disclosure includes a first substrate 100 on which a plurality of first switching elements 110 formed of a first type semiconductor are mounted; a second substrate 200 on which a plurality of second switching elements 210 formed of a second type semiconductor and one third switching element 220 formed of the first type semiconductor or the second type semiconductor are mounted; and a connection spacer 300 configured to electrically conduct between the first substrate 100 and the second substrate 200.

The first substrate 100, the second substrate 200, and the connection spacer 300 may be integrally molded.

Here, the first substrate 100 may further include a first spacer 120 together with the first switching element 110 to configure one inverter, and the second substrate 200 may further include a second spacer 230 together with the second switching element 210 to configure another inverter. In particular, a power module P composed of a plurality of inverters is characterized in that as an insulating substrate is separately composed of the first substrate 100 and the second substrate 200, the size of the entire substrate for electrical connection and heat exchange is reduced to avoid the bending deformation of each substrate due to a high temperature generated by each switching element, and thus improve durability and reliability of the power module P.

In other words, as a system is integrated and a power module of high performance is required for the high specifications and cost reduction of the power module P, the number of chips or the sizes of the chips should be increased to cover the amount of power. However, in the high-performance power module P, as the number of chips or the size of the chips are increased when the plurality of inverters is configured, the size of the insulating substrate configuring the power module P needs to be increased. However, in the related art, there is a problem in that as the size of the substrate is increased so that a single substrate is configured and covers each chip, the bending deformation occurs in the insulating substrate due to the high temperature generated when the chip is operated as the chip is gradually integrated.

The present disclosure is characterized in that the entire size of each substrate is reduced and the bending deformation of each substrate is reduced, thereby improving the durability and reliability of the power module P by separately configuring the first substrate 100 mounted on the first switching element 110 and the second substrate 200 on which the second switching element 210 is mounted.

In addition, the first substrate 100 and the second substrate 200 are electrically connected through the connection spacer 300, so that it is possible to reduce the number of bus bars for electrical connection to the outside, and reduce the internal parasite inductance by optimizing the arrangement of each bus bar 400.

In the power module according to the present disclosure, the first substrate 100, the second substrate 200, and the connection spacer 300 may be integrally molded. In other words, the power module P is composed of a first inverter INV1 corresponding to the first substrate 100 and a second inverter INV2 corresponding to the second substrate 200, and each inverter is molded and integrated.

Here, each first switching element 110 may include two chips, each second switching element 210 may include two chips, and a third switching element 220 may include one chip. Accordingly, each of the first inverter INV1 and the second inverter INV2 may be configured, and the numbers of first switching elements 110, second switching elements 210, and third switching elements 220 installed may be determined according to specifications required by each of the first inverter INV1 and the second inverter INV2.

In other words, referring to FIG. 2, a motor drive device according to one embodiment is a motor drive device for supplying driving power to a motor having a plurality of windings M corresponding to each of a plurality phases, and may include the first inverter INV1 including the plurality of first switching elements 110 and connected to a first end of each of the windings M of the motor, the second inverter INV2 including the plurality of second switching elements 210 and connected to a second end of each of the windings M of the motor, and the plurality of third switching elements 220 having each of one ends connected to the second end of each of the windings M of the motor and the other ends interconnected. On/off states of the first switching element 110, the second switching element 210, and the third switching element 220 may be each controlled by the control of a control unit C.

In this connection structure, when the third switching element 220 is turned on, the other ends of the windings M of the motor form the electrical interconnection, so that the motor has a Y-connected winding M structure having a neutral point. Accordingly, in a state in which the plurality of third switching elements 220 are turned on, the motor may be driven by deactivating the second inverter INV2 as all of the second switching elements 210 are turned off, and switching only the first switching element 110 of the first inverter INV1 through a pulse width modulation control.

When the third switching element 220 is turned off, both ends of the windings M of the motor are in a state of being connected to the first inverter INV1 and the second inverter INV2, respectively. Accordingly, in a state in which the plurality of third switching elements 220 are turned off, the motor may be driven by activating both the first inverter INV1 and the second inverter INV2 to switch both the first switching element 110 and the second switching element 210 through the pulse width modulation control.

Accordingly, the third switching element 220 may be referred to as a switching switch.

Meanwhile, the first type semiconductor configuring the first switching element 110 may be made of SiC, and the second type semiconductor configuring the second switching element 210 may be made of silicon (Si).

In other words, the first switching element 110 needs to be configured with relatively high performance as the pulse width modulation control needs to be performed by only the first switching element 110 when all of the second switching elements 210 are turned on by the third switching element 220.

In addition, when the second switching element 210 is turned off by the third switching element 220, the second switching element 210 is activated together with the first switching element 110 so that both the first switching element 110 and the second switching element 210 perform the pulse width modulation control. As described above, as the second switching element 210 is activated together with the first switching element 110 in a situation in which a high output is required, the second switching element 210 may be configured with relatively low performance.

Accordingly, the first switching element 110 may be made of silicon carbide (SiC) having high performance and low thermal resistance, and the second switching element 210 may be made of Si having low performance compared to the first switching element 110.

In addition, the third switching element 220 may be formed of the first type semiconductor, and as the third switching element 220 is made of Si having the same high performance as that of the first switching element 110, it is possible to secure reliability by switching the connection of the first inverter INV1 or the second inverter INV2.

In addition, the first substrate 100 may be configured to have a relatively high thermal conductivity characteristic compared to the second substrate 200.

In other words, as the first switching element 110 mounted on the first substrate 100 is configured with high performance compared to the second switching element 210 mounted on the second substrate 200, the amount of heat generated is also large, and thus the first substrate 100 may be configured to have a thermal resistance higher than that of the second substrate 200. Accordingly, the first substrate 100 may be made of a high thermal conductivity material such as silicon nitride (SiN) or aluminum nitride (AlN), and the second substrate 200 may be made of a low thermal conductivity material such as aluminum oxide (AlO).

The semiconductor type of each of the above-described switching elements is the embodiment according to the present disclosure, and various types of semiconductors may be applied thereto.

Meanwhile, the first substrate 100 is composed of a first upper substrate 100a and a first lower substrate 100b, the first switching element 110 is disposed between a lower surface of the first upper substrate 100a and an upper surface of the first lower substrate 100b, the second substrate 200 is composed of a second upper substrate 200a and a second lower substrate 200b, and the second switching element 210 is disposed between a lower surface of the second upper substrate 200a and an upper surface of the second lower substrate 200b.

Here, each of the first upper substrate 100a, the first lower substrate 100b, the second upper substrate 200a, and the second lower substrate 200b may be composed of an upper metal layer A1, a lower metal layer A2, and an insulator A3 interposed between the upper metal layer A1 and the lower metal layer A2.

In addition, the first switching element 110 and a first spacer 120 may be physically/electrically connected between the lower metal layer A2 of the first upper substrate 100a and the upper metal layer A1 of the first lower substrate 100b. Likewise, the second switching element 210 and the second spacer 230 may be physically/electrically connected between the lower metal layer A2 of the second upper substrate 200a and the upper metal layer A1 of the second lower substrate 200b. Accordingly, each of the upper and lower substrates may be electrically connected, and a space may be secured between each of the upper and lower substrates.

Meanwhile, the first switching element 110 is composed of a first chip 111 and a second chip 112 and is disposed to be spaced apart from the first substrate 100, and the second switching element 210 is composed of a third chip 211 and a fourth chip 212 and disposed to be spaced apart from the second substrate 200. Each of the chips consists of an isolated gate bipolar transistor (IGBT).

Referring to FIG. 2, the first chip 111 and the second chip 112 configuring the first switching element 110 include a plurality of legs to which a DC voltage is applied, and each leg configures the first inverter INV1 by corresponding to each of the plurality of phases of the motor to form the electrical connection.

In addition, the third chip 211 and the fourth chip 212 configuring the second switching element 210 include a plurality of legs to which a DC voltage is applied, and each leg configures the second inverter INV2 by corresponding to each of the plurality of phases of the motor to form the electrical connection.

Meanwhile, the third switching element 220 is connected to each of the plurality of windings M included in the motor.

Accordingly, the present disclosure may configure the first inverter INV1 and the second inverter INV2, and diversify the output of the motor according to the on/off of the third switching element 220.

Here, as shown in FIGS. 3 to 5, the first chip 111 and the second chip 112 mounted on the first substrate 100 are disposed to be spaced apart from each other, and the third chip 211 and the fourth chip 212 mounted on the second substrate 200 are disposed to be spaced apart from each other, so that it is possible to prevent a short circuit between the respective switching elements.

Meanwhile, the connection spacer 300 is electrically connected to the first chip 111 on the first substrate 100 and the third chip 211 on the second substrate 200. In other words, for the DC power, a current is transmitted to each of the first switching element 110 and the second switching element 210 for stable power use. Accordingly, the connection spacer 300 is configured to electrically connect the first inverter INV1 and the second inverter INV2 by connecting the first chip 111 on the first substrate 100 and the third chip 211 on the second substrate 200.

Meanwhile, the third switching element 220 is disposed to be spaced apart between the third chip 211 and the fourth chip 212 on the second substrate 200 so that power is selectively applied to the third chip 211 and the fourth chip 212 of the second substrate 200 according to the on/off of the third switching element 220. In addition, the third switching element 220 is disposed to be spaced apart from the third chip 211 and the fourth chip 212 to prevent a short circuit.

Meanwhile, a plurality of bus bars 400 are disposed side by side at one side of the first substrate 100 and the second substrate 200, and a plurality of control pins 500 are disposed side by side at the other sides thereof. Here, the bus bar 400 is configured to apply power to each switching element, and the control pin 500 is configured to provide a control signal to each switching element.

Here, a P-type bus bar and an N-type bus bar may be configured on the first substrate 100, and either the P-type bus bar or the N-type bus bar may be configured on the second substrate 200. In the embodiment of the present disclosure, a P-type bus bar 410 and a first N-type bus bar 420 are configured on the first substrate 100, and a second N-type bus bar 440 is configured on the second substrate 200.

In addition, a first output bus bar 430 may be configured on the first substrate 100, and a second output bus bar 450 and a switching bus bar 460 may be configured on the second substrate 200.

In other words, when the P-type and N-type bus bars are provided for each of the first substrate 100 and the second substrate 200, each output bus bar is provided, and the switching bus bar is configured, a total of seven bus bars are required. However, according to the present disclosure, the connection spacer 300 is connected to the first substrate 100 and the second substrate 200, and thus the power module P may be configured with only a total of six bus bars as the P-type bus bar 410 is reduced by replacing the P-type bus bar 410 to which a current is input to the second substrate 200 with the connection spacer 300.

In addition, in the power module P, an overshoot voltage is generated by an internal parasitic inductance by the bus bar 400 by continuous on/off operation of each switching element. The overshoot voltage increases power loss and noise of the entire system to which the power module is applied, and in severe cases, the power semiconductor device may also be damaged. This is because it is important to reduce the current path in the power module in order to reduce the parasitic inductance because the internal parasitic inductance of the power module also increases as the current path in the power module gets longer. In particular, a length of a power lead connected to the power semiconductor device in the power module also greatly affects the current path. According to the present disclosure, it is possible to reduce the size of the bus bar 400 and the size of the power module P by an insulating distance, and reduce the parasite inductance according to the arrangement of the bus bar 400 by reducing the number of bus bars 400 through the connection of the connection spacer 300 to the first substrate 100 and the second substrate 200.

The connection structure of the N-type, P-type, and N-type bus bars applied to the first substrate 100 and the second substrate 200 may be changed into a connection structure of the P-type, N-type, and P-type bus bars, but the parasite inductance of the connection structure of the N-type, P-type, and N-type bus bars is reduced more greatly, so that the present disclosure configures the P-type bus bar 410 and the first N-type bus bar 420 on the first substrate 100, and the second N-type bus bar 440 on the second substrate 200.

Meanwhile, the first N-type bus bar 420, the P-type bus bar 410, the second N-type bus bar 440, the switching bus bar 460, and the second output bus bar 450 may be arranged at one side of the first substrate 100 and the second substrate 200 side by side. In particular, the first N-type bus bar 420, the P-type bus bar 410, the second N-type bus bar 440, the switching bus bar 460, and the second output bus bar 450 each have an insulation distance and are disposed to be spaced apart from each other to prevent a short circuit between the bus bars 400.

In particular, the first output bus bar 430 and the second output bus bar 450 are disposed to be diagonally spaced farthest away from the other side of the first substrate 100 and one side of the second substrate 200. As described above, the first output bus bar 430 and the second output bus bar 450 are disposed to be spaced farthest away therefrom, so that it is possible to minimize the risk of the short circuit due to the current output through the first output bus bar 430 and the second output bus bar 450, thereby stabilizing the operation of the power module.

Meanwhile, a first control pin 510 configured to provide a control signal to the first chip 111 and a second control pion 520 configured to provide the control signal to the second chip 112 may be configured on the first substrate 100, a third control pin 530 configured to provide the control signal to the third chip 211 and a fourth control pion 540 configured to provide the control signal to the fourth chip 212 may be configured on the second substrate 200, and the first control pin 510 and the second control pin 520 of the first substrate 100 and the third control pin 530 and the fourth control pin 540 of the second substrate 200 may be arranged to be spaced apart from each other from the other sides of the first and second substrates 100 and 200.

Each control pin 500 is to input a command signal to each switching element, and each control pin 500 is disposed to be spaced apart from each other to prevent errors occurring when the signal is transmitted.

Each of the plurality of bus bars 400 and the control pins 500 described above may be disposed to be spaced apart from each other according to a required insulation distance.

Accordingly, in one embodiment, as shown in FIGS. 4 and 5, a current may flow to the first substrate 100 and the second substrate 200. Here, FIG. 4 shows lower substrates of the first substrate 100 and the second substrate 200, and FIG. 5 shows upper substrates of the first substrate 100 and the second substrate 200, and when a current is applied to the P-type bus bar 410 of the first substrate 100, a current flow is formed in the first switching element 110 according to the circuits of the upper and lower substrates of the first substrate 100. In particular, the current applied to the P-type bus bar 410 of the first substrate 100 may be moved to the second switching element 210 of the second substrate 200 through the connection spacer 300 and thus a current flow may be formed in the second switching element 210 according to the circuits of the upper and lower substrates of the second substrate 200. Here, the first switching element 110, the second switching element 210, and the third switching element 220 are turned on or turned off under the control of the control unit C, and the first inverter INV1 and the second inverter INV2 may be selectively used.

The motor drive system using the above-described power module may implement the first inverter INV1, the second inverter INV2, and the switching switch using three power modules. As one embodiment, a first power module of the three power modules includes a first leg of the first inverter INV1, a first leg of the second inverter INV2, and a first switch of the switching switch part, a second power module of the three power modules includes the first leg of the second inverter INV2, a second leg of the second inverter INV2, and a second switch of the switching switch part, and a third power module of the three power modules includes a first leg of a third inverter, a first leg of the third inverter, and a third switch of the switching switch part, so that it is possible to configure the entire power module P.

The power module composed of the above-described structure can secure high-temperature durability of the insulating substrate and improve reliability by separately configuring the insulating substrate when the plurality of inverters is configured.

In addition, as the plurality of inverters are electrically connected by the connection spacer 300 and some of the bus bars 400 of each inverter are shared, the number of bus bars 400 are reduced, and the internal parasite inductance is reduced by the arrangement structure of the bus bar 400.

Although the specific exemplary embodiments of the present disclosure have been shown and described, it will be apparent to those skilled in the art that the present disclosure may be variously improved and changed without departing from the technical spirit of the present disclosure provided by the appended claims.

What is claimed is:

1. A power module comprising:
   a first substrate comprising first material;
   a plurality of first switching elements on the first substrate;
   a second substrate comprising second material having a lower thermal conductivity than the first material;
   a plurality of second switching elements and a third switching element on the second substrate; and
   a connection spacer configured to electrically connect the first substrate and the second substrate.

2. The power module of claim 1, wherein each of the first switching elements, the second switching elements and the third switching element includes at least one chip.

3. The power module of claim 2, wherein each of the first switching elements includes two chips, each of the second switching elements includes two chips, and the third switching element includes one chip.

4. The power module of claim 1, wherein:
   the plurality of first switching elements are formed of a first type semiconductor,
   the plurality of second switching elements are formed of a second type semiconductor, and
   the third switching element is formed of the first type semiconductor or the second type semiconductor.

5. The power module of claim 4, wherein the first type semiconductor is made of SiC and the second type semiconductor is made of Si.

6. The power module of claim 4, wherein the third switching element is formed of the first type semiconductor.

7. The power module of claim 1, wherein the first substrate comprises a first upper substrate and a first lower substrate and the first switching elements are disposed between a lower surface of the first upper substrate and an upper surface of the first lower substrate; and
   wherein the second substrate comprises a second upper substrate and a second lower substrate and the second switching elements are disposed between a lower surface of the second upper substrate and an upper surface of the second lower substrate.

8. The power module of claim 7, wherein each of the first upper substrate, the first lower substrate, the second upper substrate, and the second lower substrate comprises an upper metal layer, a lower metal layer, and an insulator interposed between the upper metal layer and the lower metal layer.

9. A power module comprising:
a first substrate comprising first material;
a plurality of first switching elements on the first substrate, wherein each of the first switching elements comprises a first chip and a second chip disposed to be spaced apart from the first substrate;
a second substrate comprising second material having a lower thermal conductivity than the first material;
a plurality of second switching elements and a third switching element on the second substrate, wherein each of the second switching elements comprises a third chip and a fourth chip spaced apart from the second substrate; and
a connection spacer configured to electrically connect the first substrate and the second substrate.

10. The power module of claim 9, wherein the connection spacer is electrically connected to the first chip on the first substrate and the third chip on the second substrate.

11. The power module of claim 9, wherein the third switching element is disposed to be spaced apart between the third chip and the fourth chip on the second substrate.

12. The power module of claim 9, wherein the first substrate and the second substrate have a plurality of bus bars disposed at one side side by side, and a plurality of control pins disposed at the other side side by side.

13. The power module of claim 12, wherein a P-type bus bar, an N-type bus bar, and a first output bus bar are configured on the first substrate; and
wherein the P-type or N-type bus bar, a second output bus bar, and a switching bus bar are configured on the second substrate.

14. The power module of claim 12, wherein a P-type bus bar, a first N-type bus bar, and a first output bus bar are configured on the first substrate;
wherein a second N-type bus bar, a second output bus bar, and a switching bus bar are configured on the second substrate; and
wherein the first N-type bus bar, the P-type bus bar, the second N-type bus bar, the switching bus bar, and the second output bus bar are arranged at one side of the first substrate and the second substrate side by side.

15. The power module of claim 13, wherein the first output bus bar and the second output bus bar are disposed to be diagonally spaced farthest away from the other side of the first substrate and one side of the second substrate.

16. The power module of claim 12, wherein a first control pin configured to provide a control signal to the first chip and a second control pin configured to provide the control signal to the second chip are configured on the first substrate;
wherein a third control pin configured to provide the control signal to the third chip and a fourth control pin configured to provide the control signal to the fourth chip are configured on the second substrate; and
wherein the first control pin and the second control pin of the first substrate, and the third control pin and the fourth control pin of the second substrate are arranged to be spaced apart from each other at the other side of the first and second substrates.

17. The power module of claim 1, wherein the first substrate, the second substrate, and the connection spacer are integrally molded.

18. A motor drive system comprising:
a first inverter, a second inverter, and a switching inverter implemented using three power modules, each of the three power modules comprising:
a first substrate including first material;
a plurality of first switching elements on the first substrate;
a second substrate including second material having a lower thermal conductivity than the first material;
a plurality of second switching elements and a third switching element on the second substrate; and
a connection spacer configured to electrically connect the first substrate and the second substrate;
wherein a first power module among the three power modules includes a first leg of the first inverter, a first leg of the second inverter, and a first switch of a switching switch part;
wherein a second power module among the three power modules includes the first leg of the second inverter, a second leg of the second inverter, and a second switch of the switching switch part; and
wherein a third power module among the three power modules includes a first leg of a third inverter, a second leg of the third inverter, and a third switch of the switching switch part.

19. The motor drive system of claim 18, wherein each of the first switching elements is composed of a first chip and a second chip and disposed to be spaced apart from the first substrate, and each of the second switching elements is composed of a third chip and a fourth chip spaced apart from the second substrate.

20. The motor drive system of claim 19, wherein the connection spacer of each of the three power modules is electrically connected to the respective first chip on the first substrate and the respective third chip on the second substrate.

* * * * *